(12) United States Patent
Liu et al.

(10) Patent No.: US 10,971,555 B2
(45) Date of Patent: Apr. 6, 2021

(54) PIXEL STRUCTURE AND DISPLAY APPARATUS

(71) Applicant: KUNSHAN GO-VISIONOX OPTO-ELECTRONICS CO., LTD., Kunshan (CN)

(72) Inventors: Mingxing Liu, Kunshan (CN); Junfeng Li, Kunshan (CN); Xuliang Wang, Kunshan (CN); Feng Gao, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 28 days.

(21) Appl. No.: 16/437,110

(22) Filed: Jun. 11, 2019

(65) Prior Publication Data
US 2019/0296093 A1    Sep. 26, 2019

Related U.S. Application Data

(63) Continuation of application No. PCT/CN2018/094822, filed on Jul. 6, 2018.

(30) Foreign Application Priority Data

Aug. 31, 2017  (CN) .......................... 201710776282.8
Aug. 31, 2017  (CN) .......................... 201721113042.1

(51) Int. Cl.
*H01L 27/32*     (2006.01)
*H01L 51/00*     (2006.01)
*H01L 51/50*     (2006.01)

(52) U.S. Cl.
CPC .......... *H01L 27/3216* (2013.01); *H01L 27/32* (2013.01); *H01L 27/3218* (2013.01); *H01L 51/0011* (2013.01); *H01L 51/5012* (2013.01)

(58) Field of Classification Search
CPC . H01L 27/3213; H01L 27/3218; H01L 27/32; H01L 27/3216; H01L 51/0011;
(Continued)

(56) References Cited

U.S. PATENT DOCUMENTS

2008/0231554 A1*  9/2008  Lee ..................... H01L 27/3216
                                                              345/63
2011/0128262 A1    6/2011  Chaji et al.
(Continued)

FOREIGN PATENT DOCUMENTS

CN       102714213 A     10/2012
CN       103123927 A     5/2013
(Continued)

OTHER PUBLICATIONS

Office Action dated Jun. 13, 2019, in corresponding Taiwanese Application No. 107124122 including partial machine-generated English language translation; 12 pages.
(Continued)

*Primary Examiner* — Mouloucoulaye Inoussa
(74) *Attorney, Agent, or Firm* — Maier & Maier, PLLC

(57) ABSTRACT

Disclosed are a pixel structure and a display apparatus. The pixel structure includes a number of repeated units arranged in an array. Each repeated unit comprises one sub-pixel of a first color, two sub-pixels of a second color, and two sub-pixels of a third color. The first color, the second color, and the third color are different from one another, and on each side of the sub-pixel of the first color is arranged with one of the sub-pixels of the second color and one of the sub-pixels of the third color.

14 Claims, 10 Drawing Sheets

(58) Field of Classification Search
CPC .... H01L 51/5012; G09G 3/3208; G09G 3/20; G02F 1/134309; G02F 1/1362; G02F 1/136; G09F 9/3023; G09F 9/302; G09F 9/33; G02B 5/201; G02B 30/27; H04N 13/0447; H04N 13/0402; H04N 13/31; H04N 13/324; H04N 13/351; H04N 13/305
USPC ...... 257/40; 359/569, 559, 837; 348/E5.136, 348/E9.012; 345/89, 690
See application file for complete search history.

(56) References Cited

U.S. PATENT DOCUMENTS

| | | | |
|---|---|---|---|
| 2013/0234917 A1 | 9/2013 | Lee | |
| 2014/0085352 A1* | 3/2014 | Langendijk | H04N 13/337 345/690 |
| 2014/0307133 A1* | 10/2014 | Kawai | H04N 9/04557 348/273 |
| 2015/0144893 A1* | 5/2015 | Chen | H05B 45/60 257/40 |
| 2015/0364526 A1 | 12/2015 | Peng et al. | |
| 2016/0063911 A1 | 3/2016 | Wu et al. | |
| 2016/0126298 A1 | 5/2016 | Chen | |
| 2016/0253972 A1 | 9/2016 | Bai et al. | |
| 2016/0315127 A1* | 10/2016 | Yoon | H01L 27/3216 |
| 2018/0088260 A1* | 3/2018 | Jin | G02F 1/134309 |

FOREIGN PATENT DOCUMENTS

| | | | |
|---|---|---|---|
| CN | 104319283 | A | 1/2015 |
| CN | 104766563 | A | 7/2015 |
| CN | 103311266 | B | 10/2015 |
| CN | 204991713 | U | 1/2016 |
| CN | 105448951 | A | 3/2016 |
| CN | 105552099 | A | 5/2016 |
| CN | 105552102 | A | 5/2016 |
| CN | 106449710 | A | 2/2017 |
| CN | 106449723 | A | 2/2017 |
| CN | 106486513 | A | 3/2017 |
| CN | 106935616 | A | 7/2017 |
| CN | 108010934 | A | 5/2018 |
| CN | 108091667 | A | 5/2018 |
| JP | 2008298966 | A | 12/2008 |
| KR | 20150112447 | A | 10/2015 |
| TW | 201640656 | A | 11/2016 |

OTHER PUBLICATIONS

Translation of International Search Report and Written Opinion dated Oct. 11, 2018 of corresponding application No. PCT/CN2018/094822; 5 pages.

Chinese Office Action dated Dec. 12, 2018 of corresponding application No. 2017107762828; 10 pgs.

* cited by examiner

PIXEL STRUCTURE AND DISPLAY APPARATUS

CROSS-REFERENCE TO RELATED APPLICATION

This application is Continuation of International Patent Application No. PCT/CN2018/094822, filed on Jul. 6, 2018, entitled "PIXEL STRUCTURE AND DISPLAY DEVICE" which is claim priority of Chinese Patent Application No. 201710776282.8, filed on Aug. 31, 2017 and Chinese Patent Application No. 201721113042.1, filed on Aug. 31, 2017, and the entire disclosures of which are incorporated herein.

FIELD

The present disclosure relates to the field of flat panel display technology, and particularly to a pixel structure and a display apparatus.

BACKGROUND

The Organic Light-Emitting Diode (OLED) display apparatus is one of the research hotspots in the field of flat panel displays. Compared with the Liquid Crystal Display (LCD), the OLED display apparatus has the advantages of a wide viewing angle, a high brightness, a high contrast, a low power consumption, being light and thin, and son on. At present, in the field of flat panel displays such as mobile phones, Personal Digital Assistants (PDAs), and digital cameras, the OLED display apparatus have begun to replace the traditional liquid crystal displays.

The structure of the OLED display apparatus mainly includes a substrate, and pixels manufactured on the substrate and arranged in an array. The pixels generally form an organic electroluminescent structure through organic materials penetrating a Fine Metal Mask (FMM) at the positions corresponding to pixel positions of an array substrate by using evaporation film forming technology. Since the organic light-emitting materials of the light-emitting sub-pixels of three primary colours, i.e. red, green and blue, are different, three different kinds of organic materials are respectively evaporated for the light-emitting sub-pixels of the three primary colours, i.e. red, green and blue, at corresponding positions through the FMM during the manufacturing process. Then, the color mixture ratio of the three colors is adjusted to produce true color. In this way, the three sub-pixels of red, green, and blue independently emit light to form a pixel unit.

However, at present, the blue sub-pixels in the OLED display apparatus are fluorescent materials, and the red sub-pixels and the green sub-pixels are phosphorescent materials. Due to the limitation of materials, the luminescence lifespan of the red sub-pixels is longer than that of the green sub-pixels, and the luminescence lifespans of both the red sub-pixels and the green sub-pixels are much longer than that of the blue sub-pixels. Therefore, the service lives of the materials of the three sub-pixels are unbalanced.

The existing pixel arrangement is also not conducive to the balance of the lifespans of current materials. Moreover, with the development of high resolution of the display panel, it is a technical problem to be solved by those skilled in the art of how to arrange pixels to improve the resolution as well as balance the material lifespans.

SUMMARY

The present disclosure provides a pixel structure and a display apparatus, and an objective thereof is to improve the resolution of the display apparatus.

Another object of the present disclosure is to balance sub-pixels of different material lifespans.

In order to achieve the foregoing objectives, the present disclosure provides a pixel structure, comprising a plurality of repeated units arranged in an array, each repeated unit comprising one sub-pixel of a first color, two sub-pixels of a second color, and two sub-pixels of a third color, wherein the first color, the second color, and the third color are different from one another, and one of the sub-pixels of the second color and one of the sub-pixels of the third color are arranged on each side of the sub-pixel of the first color.

Optionally, among the sub-pixel of the first color, the sub-pixel of the second color, and the sub-pixel of the third color, the sub-pixel with the maximum brightness is divided into two secondary sub-pixels.

Optionally, among the sub-pixel of the first color, the sub-pixel of the second color, and the sub-pixel of the third color, the sub-pixel with the maximum brightness has a smaller area than remaining ones of the sub-pixels.

Optionally, the sub-pixel with the maximum brightness is the sub-pixel of the second color, and the area of sub-pixel of the second color is half of the area of each of sub-pixel of the first color and sub-pixel of the third color.

Optionally, the sub-pixel with the maximum brightness is the sub-pixel of the second color, and the sub-pixel of the second color is divided into two secondary sub-pixels. The sub-pixel of the first color is shared by the sub-pixel of the second color and the sub-pixels of the third color on each sides of the sub-pixel of the first color to form two pixel unit groups, and in each of the pixel unit groups, the sub-pixel of the first color and the sub-pixel of the third color form one pixel unit with each of the two secondary sub-pixels divided from the sub-pixel of the second color.

Optionally, the first color and the third color are selected from red and blue, and the second color is green.

Optionally, the sub-pixel of the first color is divided into two secondary sub-pixels, and the two secondary sub-pixels divided from the sub-pixel of the first color form two pixel units with the sub-pixel of the second color and the sub-pixel of the third color on opposing sides of the sub-pixel of the first color.

Optionally, the first color is green, and the second color and the third color are selected from red and blue.

Optionally, the divided two secondary sub-pixels are simultaneously evaporated formed through evaporation by using one opening of an evaporation mask.

Optionally, a plurality of sub-pixels in the repeated unit is arranged along a first direction, and repeated units adjacent in a second direction are misaligned in the first direction.

Optionally, the first direction is a row direction, and the second direction is a column direction. The repeated units of odd-numbered rows are aligned with each other, the repeated units of even-numbered rows are aligned with each other; and the repeated units of even-numbered rows and the repeated units of odd-numbered rows are misaligned in the row direction; or the first direction is a column direction, and the second direction is a row direction. The repeated units of odd-numbered columns are aligned with each other, and the repeated units of even-numbered columns are aligned with each other; and the repeated units of even-numbered columns and the repeated units of odd-numbered columns are misaligned in the column direction.

Optionally, in two adjacent repeated units in the second direction, the pixel unit in one repeated unit is used for realizing left eye display, and the pixel unit in the other repeated unit is used for realizing right eye display.

Optionally, the first direction is perpendicular to the second direction.

Optionally, the shape of the sub-pixel of the first color is rectangle, triangle, pentagon, hexagon, or octagon; the shape of the sub-pixel of the second color is rectangle, triangle, pentagon, hexagon, or octagon; and the shape of the sub-pixel of the third color is rectangle, triangle, pentagon, hexagon, or octagon.

Optionally, in two adjacent repeated units in the second direction, the pixel unit in one repeated unit is used for realizing left eye display, and the pixel unit in the other repeated unit is used for realizing right eye display.

Optionally, the colors of adjacent sub-pixels each from one of the two adjacent repeated units are different.

Accordingly, the present disclosure also provides a display apparatus, comprising the foregoing pixel structure.

The pixel structure and the display apparatus provided in the present disclosure have the following beneficial effects:

1. The pixel structure comprises a plurality of repeated units arranged in an array, each repeated unit comprising a plurality of sub-pixels having three colors, wherein there is one sub-pixel of one color, and there are two sub-pixels of the other two colors located on oppsing sides of the sub-pixel of one color. The sub-pixel in the middle forms two pixel units with the two sub-pixels on its opposing sides, respectively, so that the sharing of the sub-pixel is able to be achieved, and thus the resolution of the display apparatus is able to be improved. In addition, among the sub-pixels of the three colors, the sub-pixel with the maximum brightness is divided into two secondary sub-pixels, so that the number of sub-pixels with the maximum brightness is increased, thereby enabling the increasment of the Pixels Per Inch (PPI), and further enabling the improved resolution of the display apparatus. Moreover, a same opening of an evaporation mask is able to be used to evaporate two divided sub-pixels, thereby reducing difficulties of the preparation process and the evaporation process of the evaporation mask.

2. When the first sub-pixel is a red sub-pixel or a blue sub-pixel, the sharing of the sub-pixels of longer service life is able to be achieved, thereby balancing the sub-pixels of different material lifespans, and improving service life of the display apparatus.

3. The adjacent repeated units in the second direction are arranged in the first direction in a misaligned manner, so that the pixels are arranged more uniform, thereby enabling the improved display effect of the display apparatus.

4. In two adjacent pixel unit groups in the second direction, the pixel units in one pixel unit group are used for realizing left eye display and the pixel units in another pixel unit group are used for achieving right eye display through time-sharing control, so that the display apparatus including the pixel structure is able to be used for realizing Virtual Reality (VR) and three-dimensional (3D) display.

DETAILED DESCRIPTION

In order to make the contents of the present disclosure clearer and easier to be understood, the contents of the present disclosure are described below in more detail with reference to the accompanying drawings.

Embodiment I

Figure 1:
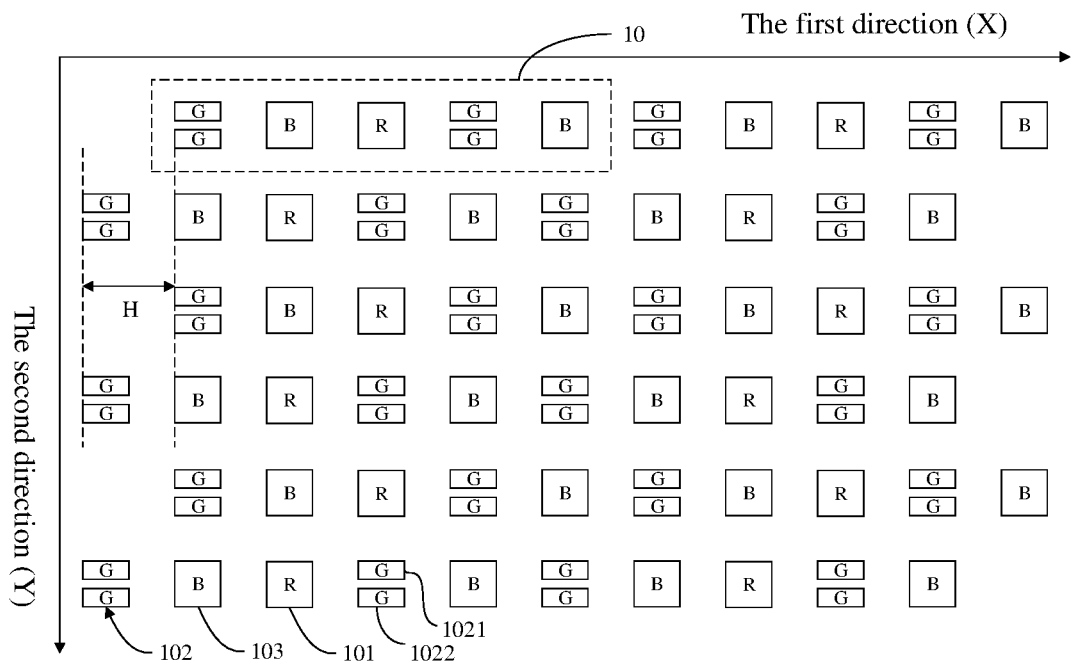
FIG. 1 is a schematic structural diagram of a pixel structure according to Embodiment I of the present disclosure.

FIG. 1 is a schematic structural diagram of a pixel structure according to Embodiment I of the present disclosure.

As shown in FIG. 1, the present disclosure provides a pixel structure, comprising a plurality of repeated units 10 arranged in an array. The repeated units 10 are repeatedly arranged along a first direction and a second direction. Each repeated unit 10 comprises one first sub-pixel 101, two second sub-pixels 102, and two third sub-pixels 103, which are arranged in the first direction. The first sub-pixel 101 is located in the middle, and the second sub-pixel 102 and the third sub-pixel 103 are located on opposing sides of the first sub-pixel 101, respectively. Moreover, among the three sub-pixels, the sub-pixel with the maximum brightness is divided into two secondary sub-pixels in the second direction.

Preferably, the first direction is perpendicular to the second direction. In this embodiment, as shown in FIG. 1, the first direction is a row direction (an X direction), and the second direction is a column direction (a Y direction).

Figure 2:
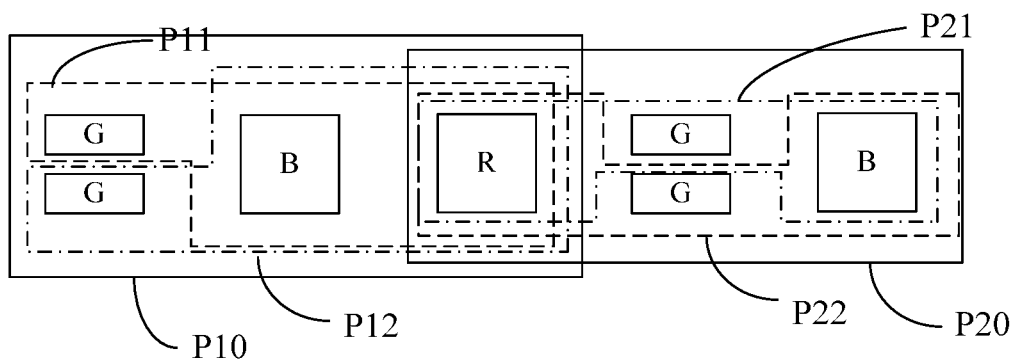
FIG. 2 is a schematic diagram of the division of a repeated unit in Embodiment I of the present disclosure.

In this embodiment, the repeated unit 10 comprises a second sub-pixel 102, a third sub-pixel 103, a first sub-pixel 101, a second sub-pixel 102, and a third sub-pixel 103, which are sequentially arranged along the first direction (along the X direction). The first sub-pixel 101 is respectively shared by the second sub-pixel 102 and the third sub-pixel 103 on each side of the first sub-pixel 101 to form two pixel unit groups. As shown in FIG. 2, the first pixel unit group P10 is formed by the first sub-pixel 101 as well as the second sub-pixel 102 and the third sub-pixel 103 located on one side (i.e., the left side in FIG. 2) of the first sub-pixel 101; and the second pixel unit group P20 is formed by the first sub-pixel 101 as well as the second sub-pixel 102 and the third sub-pixel 103 located on the other side (i.e., the right side in FIG. 2) of the first sub-pixel 101.

Moreover, the second sub-pixel 102 is divided into two secondary sub-pixels in the second direction (in the Y direction). In the first pixel unit P10, the first sub-pixel 101 and the third sub-pixel 103 are shared by two secondary sub-pixels divided from the second sub-pixel 102 to form two pixel units. Specifically, the first pixel unit P11 is formed by the first sub-pixel 101 as well as the third sub-pixel 103 and one secondary sub-pixel (i.e., the upper side in FIG. 2) divided from the second sub-pixel 102; and the second pixel unit P12 is formed by the first sub-pixel 101 as well as the third sub-pixel 103 and the other secondary sub-pixel (i.e., the lower side in FIG. 2) divided from the second sub-pixel 102. Accordingly, in the second pixel unit P20, the third pixel unit P21 is formed by the first sub-pixel 101 as well as the third sub-pixel 103 and one secondary sub-pixel (i.e., the upper side in FIG. 2) divided from the second sub-pixel 102; and the fourth pixel unit P22 is formed by the first sub-pixel 101 as well as the third sub-pixel 103 and the other secondary sub-pixel (i.e., the lower side in FIG. 2) divided from the second sub-pixel 102.

In this embodiment, four pixel units are formed in each repeated unit 10, and the first sub-pixel 101 is shared in four times, and the third sub-pixel 103 is shared in twice. The sharing of the sub-pixels enables more pixel units to be formed in the same area, which is beneficial to improve the resolution of the display apparatus. Optionally, the first sub-pixel 101 may be divided into two or four sub-pixels, and each of the two divided sub-pixels is shared in twice; or each of the four divided sub-pixels forms one pixel unit with the remaining sub-pixels; or the third sub-pixel 103 may be divided into two sub-pixels, each sub-pixel forming one pixel unit with the remaining sub-pixels. The first sub-pixel 101 and the third sub-pixel 103 may also be simultaneously divided. In such a way, a same opening of an evaporation mask is able to be used to evaporate two or four divided sub-pixels, reducing difficulties of the preparation process and the evaporation process of the evaporation mask.

In this embodiment, the first sub-pixel 101 may be a red sub-pixel, the second sub-pixel 102 may be a green sub-pixel, and the third sub-pixel 103 may be a blue sub-pixel. Each of the pixel units includes a red sub-pixel, a green sub-pixel, and a blue sub-pixel, so that full-color display is able to be achieved. Since the red sub-pixel has a maximum service life, the red sub-pixel is shared in four times, resulting in a maximum use of the red sub-pixel. Since the green sub-pixel is brightest, the green sub-pixel is divided into two sub-pixels, which will not affect the brightness of the display apparatus. Moreover, as the brightest sub-pixel (the green sub-pixel) is used to calculate the PPI, the increased number of green sub-pixels improves the PPI and further improves the resolution of the display apparatus. Meanwhile, the same opening of the evaporation mask is able to be used to simultaneously evaporate two divided sub-pixels, reducing difficulties of the preparation process and the evaporation process of the evaporation mask.

In other embodiments, the first sub-pixel 101 may be a blue sub-pixel, the second sub-pixel 102 may be a green sub-pixel, and the third sub-pixel 103 may be a red sub-pixel. Thus, the blue sub-pixel is shared four times, and the red sub-pixel is shared twice. The blue sub-pixel and the red sub-pixel may be divided according to the number of times of sharing.

In this embodiment, preferably, the first sub-pixel 101 and the third sub-pixel 103 have the same shape and area. Therefore, the first sub-pixel 101 and the third sub-pixel 103 are able to be evaporated by using the same evaporation mask, thereby saving the preparation cost of the mask. The shapes and areas of the first sub-pixel 101 and the third sub-pixel 103 may also be different, for example, the shapes are same, and the areas are different; or the shapes are different, and the areas are same; or the shapes and areas are both different.

More preferably, the shape of the first sub-pixel 101 and the third sub-pixel 103 is rectangle or square. The second sub-pixel 102 is divided into two sub-pixels, that is a first green secondary sub-pixel 1021 and a second green secondary sub-pixel 1022 each having a rectangular shape, and the long-sides of the first green secondary sub-pixel 1021 and the second green secondary sub-pixel 1022 are parallel to the first direction with the short-sides of the first green secondary sub-pixel 1021 and the second green secondary sub-pixel 1022 being parallel to the second direction. For example, the shapes of the first sub-pixel 101 and the third sub-pixel 103 are square. The length of the long sides of the first green secondary sub-pixel 1021 and the second green secondary sub-pixel 1022 is twice the length of the short sides of the first green secondary sub-pixel 1021 and the second green secondary sub-pixel 1022. However, it should be understood that the shapes of the first sub-pixel 101, the second sub-pixel 102, and the third sub-pixel 103 are not limited to rectangle, and may be other quadrangles other than rectangle, or may be selected from the group consisting of triangle, pentagon, hexagon, octagon and combinations thereof. The shape and/or area of each sub-pixel may be accordingly adjusted according to the color matching requirements.

Each sub-pixel includes a light-emitting region (a display region) and a non-light-emitting region (a non-display region). The light-emitting region of each sub-pixel includes a cathode, an anode, and an electroluminescent layer (an organic light-emitting layer), wherein the electroluminescent layer is located between the cathode and the anode, and configured to generate light of a predetermined color to achieve display. Generally, the electroluminescent layers of corresponding colors (i.e., red, green, or blue) in the light-emitting regions of the pixel regions having corresponding colors is formed by three layers evaporation processes. If the shapes and the areas of the first sub-pixel 101 and the third sub-pixel 103 are same, a same mask is able to be used to form the electroluminescent layers of red and blue, so that only two masks are needed and prepared, thereby saving the preparation cost of the mask.

Preferably, the adjacent repeated units 10 in the second direction are arranged in the first direction in a misaligned manner Specifically, the repeated units 10 of the odd-numbered rows are aligned with each other, that is, the arrangements of the repeated units 10 of the odd-numbered rows are identical. The repeated units 10 of the even-numbered rows are aligned with each other, that is, the arrangements of the repeated units 10 of the even-numbered rows are identical. The repeated units 10 of the even-numbered rows and the repeated units 10 of the odd-numbered rows are misaligned in the row direction.

Preferably, the repeated units 10 of the even-numbered rows and the repeated units 10 of the odd-numbered rows are misaligned in the row direction by the distance of at least one sub-pixel. In this embodiment, the repeated units 10 are misaligned by the distance of at least one green sub-pixel. As shown in FIG. 1, the distance H between one green sub-pixel at the leftmost end of the odd-numbered column and one green sub-pixel at the leftmost end of the even-numbered column includes the length of the green sub-pixel in the first direction, and further includes the gap between the green sub-pixel and the blue sub-pixel of the odd-numbered row. The repeated units 10 of the even-numbered rows and the repeated units 10 of the odd-numbered rows are misaligned in the row direction, enabling a more uniform pixel arrangement, thereby resulting in an improved display effect of the display apparatus.

It should be noted that, through time sequence control of two adjacent repeated units in the second direction, the pixel units in one repeated unit are able to realize left eye display, and the pixel units in the other repeated unit are able to realize right eye display, enabling the application of such pixel structure in VR and 3D display technologies. Alternatively, in one repeated unit, the first pixel unit group P10 is controlled to realize left eye display, and the second pixel unit group P20 is controlled to realize right eye display; or in the first pixel unit group P10, the first pixel unit P11 is controlled to realize left eye display, and the second pixel unit P12 is controlled to realize right eye display, enabling the application of such pixel structure in VR and 3D display technologies.

It can be understood that, in another embodiment of the present disclosure, the first direction may be a column direction (i.e., the Y direction in FIG. 1), and the second direction may be a row direction (i.e., the X direction in FIG. 1). Thus, the schematic structural diagram of the pixel structure described in FIG. 1 needs to be adjusted to obtain a pixel structure described in another embodiment. Since the pixel structure of the another embodiment is similar to the pixel structure above, details are not described in the present disclosure again.

Embodiment II

Figure 3:
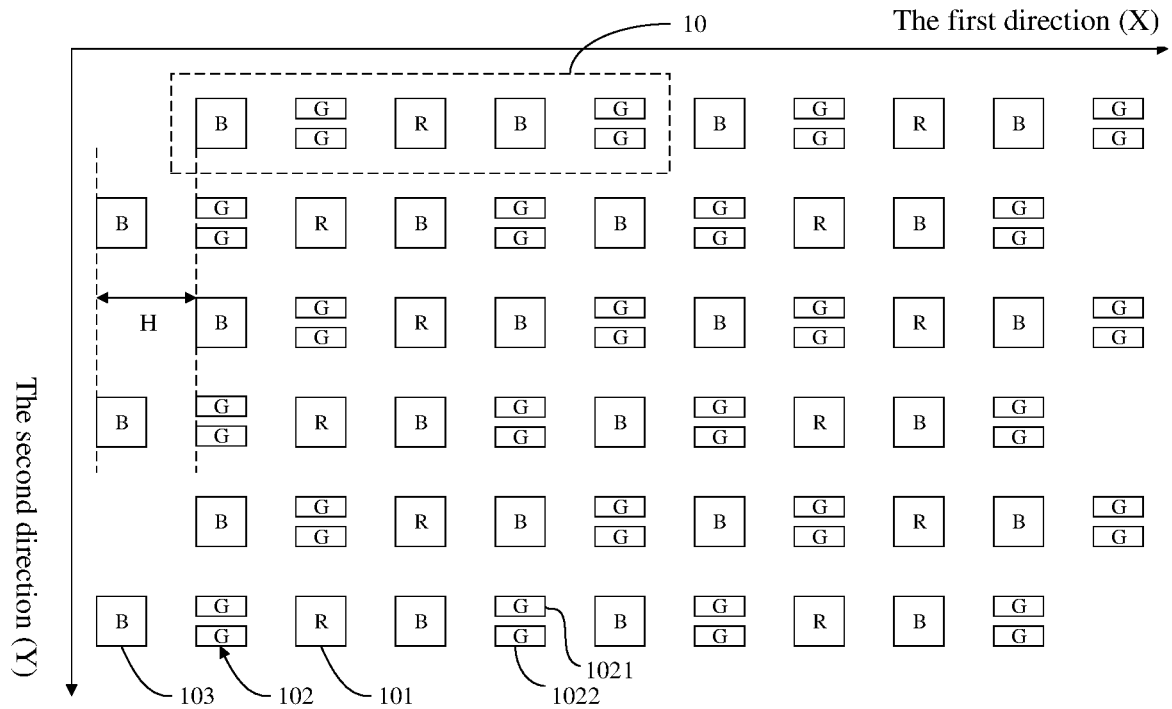
FIG. 3 is a schematic structural diagram of a pixel structure according to Embodiment II of the present disclosure.

FIG. 3 is a schematic structural diagram of a pixel structure according to Embodiment II of the present disclosure. As shown in FIG. 3, the present disclosure provides a pixel structure, comprising a plurality of repeated units 10 arranged in an array. The repeated units 10 are repeatedly arranged along a first direction and a second direction. Each repeated unit 10 comprises one first sub-pixel 101, two second sub-pixels 102, and two third sub-pixels 103, which are arranged in the first direction. The first sub-pixel 101 is located in the middle, and the second sub-pixel 102 and the third sub-pixel 103 are located on opposing sides of the first sub-pixel 101, respectively. Moreover, among the three sub-pixels, the sub-pixel with the maximum brightness is divided into two secondary sub-pixels in the second direction.

The difference between this embodiment and Embodiment I is that, in this embodiment, the repeated unit 10 comprises a third sub-pixel 103, a second sub-pixel 102, and a first sub-pixel 101, a third sub-pixel 103 and a second sub-pixel 102, which are sequentially arranged along the first direction.

Figure 4:
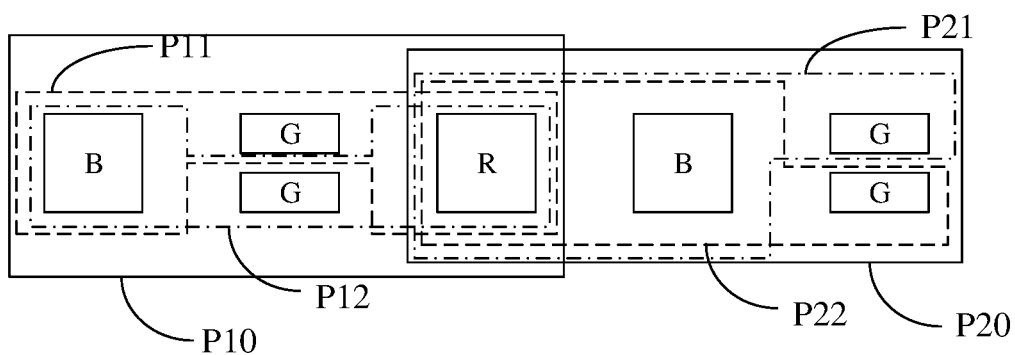
FIG. 4 is a schematic diagram of the division of a repeated unit in Embodiment II of the present disclosure.

In this embodiment, the repeated unit 10 comprises a third sub-pixel 103, a second sub-pixel 102, a first sub-pixel 101, a third sub-array 103, and a second sub-pixel 102, which are sequentially arranged along the first direction (along the X direction). The first sub-pixel 101 is shared by the second sub-pixel 102 and the third sub-pixel 103 on each side thereof to form two pixel unit groups, respectively. As shown in FIG. 4, the first pixel unit group P10 is formed by the first sub-pixel 101 as well as the second sub-pixel 102 and the third sub-pixel 103 located on one side (i.e., the left side in FIG. 4) of the first sub-pixel 101; and the second pixel unit group P20 is formed by the first sub-pixel 101 as well asthe second sub-pixel 102 and the third sub-pixel 103 located on the other side (i.e., the right side in FIG. 4) of the first sub-pixel 101.

Moreover, the second sub-pixel 102 is divided into two secondary sub-pixels in the second direction (in the Y direction). In the first pixel unit P10, the first sub-pixel 101 and the third sub-pixel 103 are shared by two secondary sub-pixels divided from the second sub-pixel 102 to form two pixel units. Specifically, the first pixel unit P11 is formed by the first sub-pixel 101 as well as the third sub-pixel 103 and one secondary sub-pixel (i.e., the upper side in FIG. 4) divided from the second sub-pixel 102; and the second pixel unit P12 is formed by the first sub-pixel 101 as well as the third sub-pixel 103 and the other secondary sub-pixel (i.e., the lower side in FIG. 4) divided from the second sub-pixel 102. Accordingly, in the second pixel unit P20, the third pixel unit P21 is formed by the first sub-pixel 101 as well as the third sub-pixel 103 and one secondary sub-pixel (i.e., the upper side in FIG. 4) divided from the second sub-pixel 102; and the fourth pixel unit P22 is formed by the first sub-pixel 101 as well as the third sub-pixel 103 and the other secondary sub-pixel (i.e., the lower side in FIG. 4) divided from the second sub-pixel 102.

In this embodiment, the repeated units 10 of the even-numbered rows and the repeated units 10 of the odd-numbered rows are misaligned in the row direction by the distance of at least one blue sub-pixel. As shown in FIG. 3, the distance H between one blue sub-pixel at the leftmost end of the odd-numbered column and one blue sub-pixel at the leftmost end of the even-numbered column includes the length of the blue sub-pixel in the first direction, and further includes a gap between the blue sub-pixel and the green sub-pixel of the odd-numbered row. The repeated units 10 of the even-numbered rows and the repeated units 10 of the odd-numbered rows are misaligned in the row direction, enabling a more uniform pixel arrangement, thereby resulting in an improved display effect of the display apparatus.

It can be understood that, in another embodiment of the present disclosure, the first direction may be a column direction (i.e., the Y direction in FIG. 3), and the second direction may be a row direction (i.e., the X direction in FIG. 3). Thus, the schematic structural diagram of the pixel structure described in FIG. 3 needs to be adjusted to obtain a pixel structure described in another embodiment. Since the pixel structure of another embodiment is similar to the pixel structure above, details are not described in the present disclosure again.

Embodiment III

Figure 5:
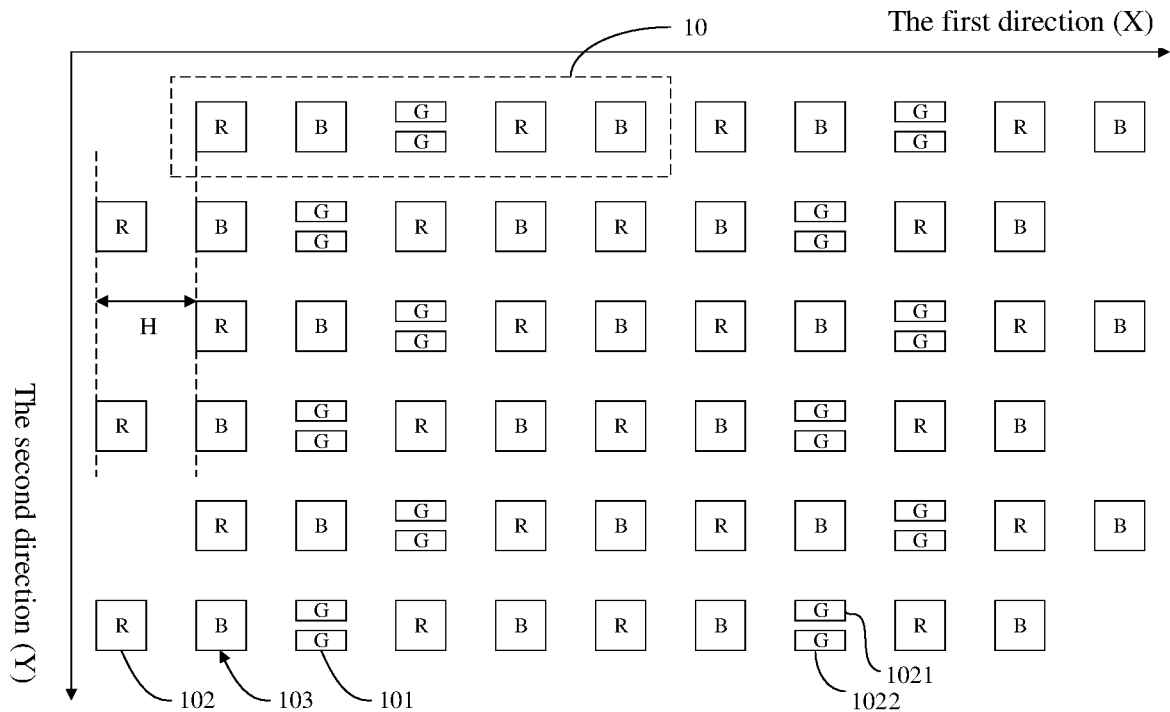
FIG. 5 is a schematic structural diagram of a pixel structure according to Embodiment III of the present disclosure.

FIG. 5 is a schematic structural diagram of a pixel structure according to Embodiment III of the present disclosure. Only a part of the pixel structure is shown in the drawing for the purpose of simplicity and convenience. The number of pixels in the actual product is not limited thereto, and the number of pixel units may be changed according to the actual display requirements.

As shown in FIG. 5, the present disclosure provides a pixel structure, comprising a plurality of repeated units 10 arranged in an array. The repeated units 10 are repeatedly arranged along a first direction and a second direction. Each repeated unit 10 comprises three sub-pixels of different colors arranged along the first direction. The repeated unit 10 comprises one first sub-pixel 101, two second sub-pixels 102, and two third sub-pixels 103. The first sub-pixel 101 is located in the middle, and the second sub-pixel 102 and the third sub-pixel 103 are located on opposing sides of the first sub-pixel 101, respectively. Moreover, among the three sub-pixels, the sub-pixel with the maximum brightness is divided into two secondary sub-pixels in the second direction.

The difference between this embodiment and Embodiment I is that, in this embodiment, the first sub-pixel 101 is a green sub-pixel, the second sub-pixel 102 is a red sub-pixel, and the third sub-pixel 103 is a blue sub-pixel.

Figure 6:
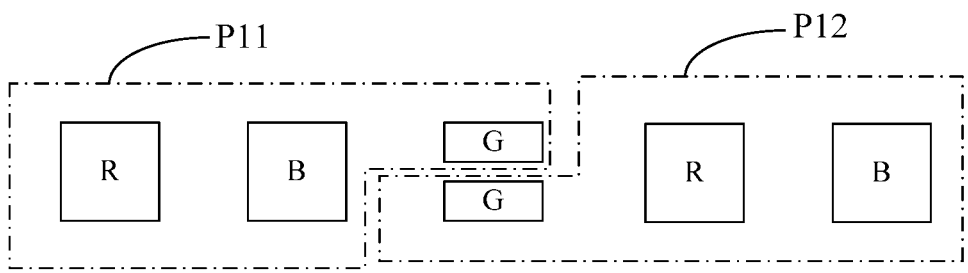
FIG. 6 is a schematic diagram of the division of a repeated unit in Embodiment III of the present disclosure.

In this embodiment, the repeated unit 10 comprises a second sub-pixel 102, a third sub-pixel 103, a first sub-pixel 101, a second sub-pixel 102, and a third sub-pixel 103, which are sequentially arranged along the first direction (along the X direction). The first sub-pixel 101 is divided into two secondary sub-pixels in the second direction (in the Y direction), and two pixel units are formed by the two secondary sub-pixels divided from the first sub-pixel 101 as well as the second sub-pixel 102 and the third sub-pixel 103. Specifically, the first pixel unit P11 is formed by the second sub-pixel 102 as well as the third sub-pixel 103 and one secondary sub-pixel (i.e., the upper side in FIG. 6) divided from the first sub-pixel 101; and the second pixel unit P12 is formed by the second sub-pixel 102 as well as the third sub-pixel 103 and the other secondary sub-pixel (i.e., the lower side in FIG. 6) divided from the first sub-pixel 101.

In this embodiment, the first sub-pixel 101 is a green sub-pixel, the second sub-pixel 102 is a red sub-pixel, and the third sub-pixel 103 is a blue sub-pixel. Each of the pixel units includes a red sub-pixel, a green sub-pixel, and a blue sub-pixel, so that full-color display is able to be achieved. Since the green sub-pixel is brightest, the green sub-pixel is divided into two secondary sub-pixels, which will not affect the brightness of the display apparatus. Moreover, as the brightest sub-pixel (the green sub-pixel) is used to calculate the PPI, the increased number of green sub-pixels improves the PPI and further improves the resolution of the display apparatus. Meanwhile, the same opening of the evaporation mask is able to be used to simultaneously evaporate two divided sub-pixels, reducing difficulties of the preparation process and the evaporation process of the evaporation mask.

In other embodiments, the first sub-pixel 101 may be a green sub-pixel, the second sub-pixel 102 may be a blue sub-pixel, and the third sub-pixel 103 may be a red sub-pixel.

In this embodiment, preferably, the second sub-pixel 102 and the third sub-pixel 103 have the same shape and area. Therefore, the second sub-pixel 102 and the third sub-pixel 103 are able to be evaporated by using the same evaporation mask, thereby saving the preparation cost of the mask. The shapes and areas of the second sub-pixel 102 and the third sub-pixel 103 may also be different, for example, the shapes are same, and the areas are different; or the shapes are different, and the areas are same; or the shapes and areas are both different.

More preferably, the shape of the second sub-pixel 102 and the third sub-pixel 103 is rectangle or square. The first sub-pixel 101 is divided into two secondary sub-pixels, that is a first green secondary sub-pixel 1021 and a second green secondary sub-pixel 1022 each having a rectangular shape. The long-sides of the first green secondary sub-pixel 1021 and the second green secondary sub-pixel 1022 are parallel to the first direction and the short-sides of the first green secondary sub-pixel 1021 and the second green secondary sub-pixel 1022 are parallel to the second direction. For example, the shapes of the first sub-pixel 101 and the third sub-pixel 103 are square. For the first green secondary sub-pixel 1021 and the second green secondary sub-pixel 1022, the length of long sides of the first green secondary sub-pixel 1021 and the second green secondary sub-pixel 1022 secondary is twice the lengths of their short sides. However, it should be understood that the shapes of the first sub-pixel 101, the second sub-pixel 102, and the third sub-pixel 103 are not limited to rectangle, and may be other quadrangles excluding rectangle, or may be selected from the group consisting of triangle, pentagon, hexagon, octagon and combinations thereof. The shape and/or area of each sub-pixel may be accordingly adjusted according to the color matching requirements.

Each sub-pixel includes a light-emitting region (a display region) and a non-light-emitting region (a non-display region). The light-emitting region of each sub-pixel includes a cathode, an anode, and an electroluminescent layer (an organic light-emitting layer), and the electroluminescent layer is located between the cathode and the anode and is configured to generate light of a predetermined color to achieve display. Generally, the electroluminescent layers of corresponding colors (i.e., red, green, or blue) in the light-emitting regions of the pixel regions having corresponding colors is formed by three layers evaporation processes. If the shapes and the areas of the second sub-pixel 102 and the third sub-pixel 103 are same, a same mask is able to be used to form the electroluminescent layers of red and blue, so that only two masks are needed and prepared, thereby saving the preparation cost of the mask.

The adjacent repeated units 10 in the second direction are arranged in the first direction in a misaligned manner Specifically, the repeated units 10 of the odd-numbered rows are aligned with each other, that is, the arrangements of the repeated units 10 of the odd-numbered rows are identical. The repeated units 10 of the even-numbered rows are aligned with each other, that is, the arrangements of the repeated units 10 of the even-numbered rows are identical. The repeated units 10 of the even-numbered rows and the repeated units 10 of the odd-numbered rows are misaligned in the row direction, so that the pixel arrangement is more uniform, thereby improving the display effect of the display apparatus.

Preferably, the repeated units 10 of the even-numbered rows and the repeated units 10 of the odd-numbered rows are misaligned in the row direction by the distance of at least one sub-pixel. In this embodiment, the repeated units are misaligned by the distance of at least one red sub-pixel. As shown in FIG. 5, the distance H between one red sub-pixel at the leftmost end of the odd-numbered column and one red sub-pixel at the leftmost end of the even-numbered column includes the length of the red sub-pixel in the first direction, and further includes a gap between the red sub-pixel and the green sub-pixel in the odd-numbered row.

It should be noted that, through time sequence control of two adjacent repeated units in the second direction, the pixel units in one repeated unit are able to realize left eye display, and the pixel units in the other repeated unit are able to realize right eye display, enabling the application of such pixel structure in VR and 3D display technologies. Alternatively, in one repeated unit, the first pixel unit P11 may be controlled to realize left eye display, and the second pixel unit P12 may be controlled to realize right eye display.

It can be understood that, in another embodiment of the present disclosure, the first direction may be a column direction (i.e., the Y direction in FIG. 5), and the second direction may be a row direction (i.e., the X direction in FIG. 5). Thus, the schematic structural diagram of the pixel structure described in FIG. 1 needs to be adjusted to obtain a pixel structure described in another embodiment. Since the pixel structure of another embodiment is similar to the pixel structure above, details are not described in the present disclosure again.

Embodiment IV

Figure 7:
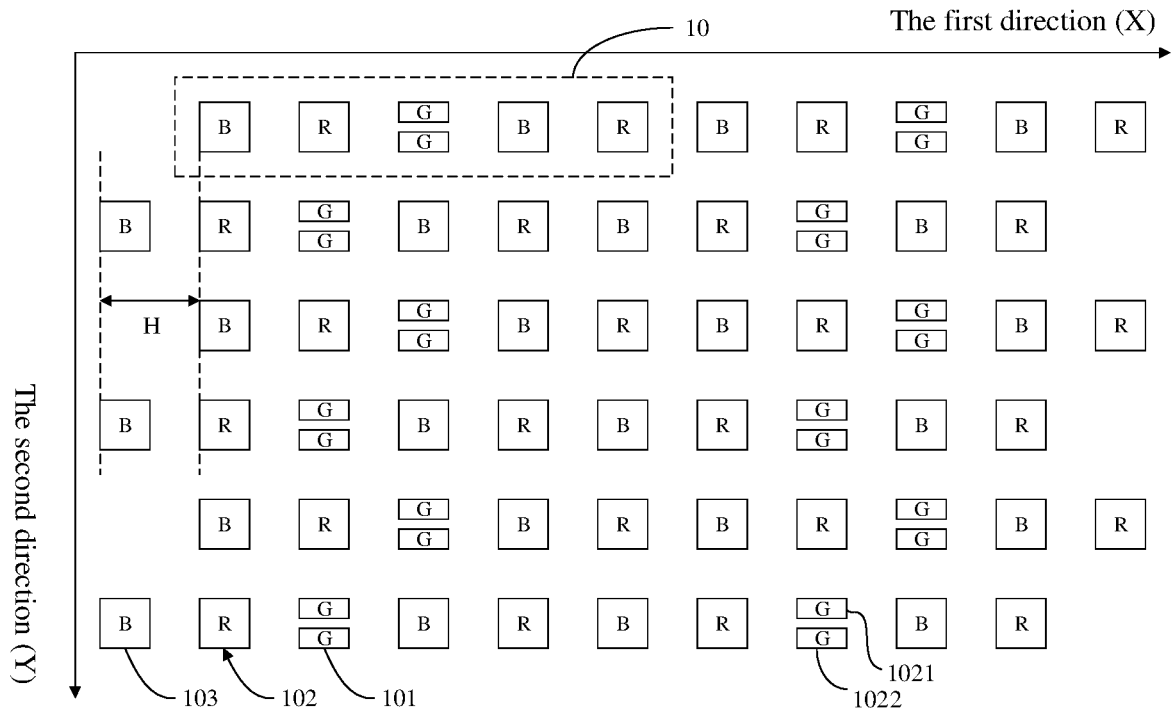
FIG. 7 is a schematic structural diagram of a pixel structure according to Embodiment IV of the present disclosure.

FIG. 7 is a schematic structural diagram of a pixel structure according to Embodiment IV of the present disclosure. As shown in FIG. 7, the present disclosure provides a pixel structure, comprising a plurality of repeated units 10 arranged in an array. The repeated units 10 are repeatedly arranged along a first direction and a second direction. Each repeated unit 10 comprises three sub-pixels of different colors arranged in the first direction, wherein the repeated unit 10 comprises one first sub-pixel 101, two second sub-pixels 102, and two third sub-pixels 103; the first sub-pixel 101 is located in the middle, and the second sub-pixel 102 and the third sub-pixel 103 are located on opposing sides of the first sub-pixel 101, respectively. Moreover, among the three sub-pixels, the sub-pixel with the maximum brightness is divided into two secondary sub-pixels in the second direction.

Figure 8:
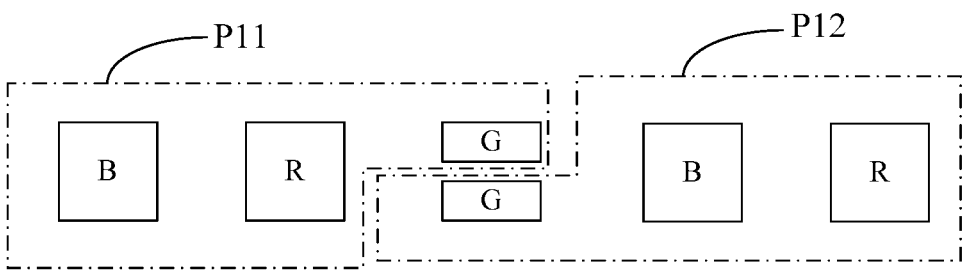
FIG. 8 is a schematic diagram of the division of a repeated unit in Embodiment IV of the present disclosure.

In this embodiment, the repeated unit 10 comprises a third sub-pixel 103, a second sub-pixel 102, a first sub-pixel 101, a third sub-pixel 103, and a second sub-pixel 102, which are sequentially arranged along the first direction (along the X direction). The two secondary sub-pixels divided from the first sub-pixel 101 respectively form two pixel units with the second sub-pixel 102 and the third sub-pixel 103, as shown in FIG. 8. Specifically, the first pixel unit P11 is formed by the second sub-pixel 102 as well as the third sub-pixel 103 and one secondary sub-pixel (i.e., the upper side in FIG. 8) divided from the first sub-pixel 101; and the second pixel unit P12 is formed by the second sub-pixel 102 as well as the third sub-pixel 103 and the other secondary sub-pixel (i.e., the lower side in FIG. 8) divided from the first sub-pixel 101.

In this embodiment, the repeated units 10 of the even-numbered rows and the repeated units 10 of the odd-numbered rows are misaligned in the row direction by the distance of at least one blue sub-pixel. As shown in FIG. 7, the distance H between one blue sub-pixel at the leftmost end of the odd-numbered column and one blue sub-pixel at the leftmost end of the even-numbered column includes the length of the blue sub-pixel in the first direction, and further includes the gap between the blue sub-pixel and the red sub-pixel of the odd-numbered row.

It can be understood that, in another embodiment of the present disclosure, the first direction may be a column direction (i.e., the Y direction in FIG. 7), and the second direction may be a row direction (i.e., the X direction in FIG. 7). Thus, the schematic structural diagram of the pixel structure described in FIG. 3 needs to be adjusted to obtain a pixel structure described in another embodiment. Since the pixel structure of another embodiment is similar to the pixel structure above, details are not described in the present disclosure again.

Embodiment V

In the above Embodiments I to IV, the arrangement of two sub-pixels on each side of the first sub-pixel is the same, and each repeated unit in each row is identical.

Figure 9A:
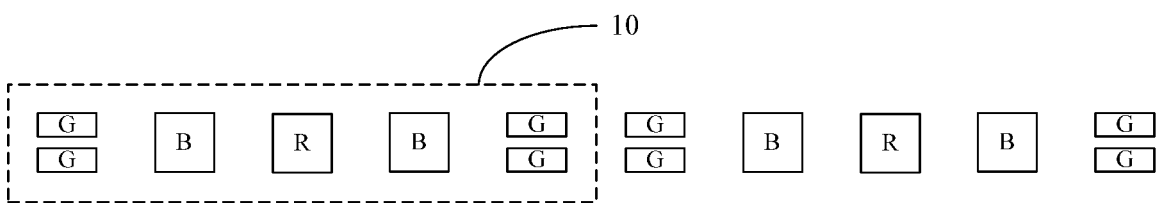
FIG. 9a is schematic structural diagram of two adjacent repeated units according to Embodiment V of the present disclosure.
Figure 9B:
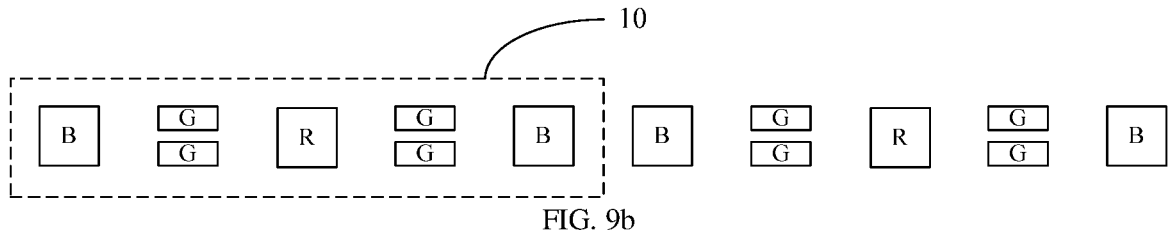
FIG. 9b is schematic structural diagram of two adjacent repeated units according to Embodiment V of the present disclosure.
Figure 9C:
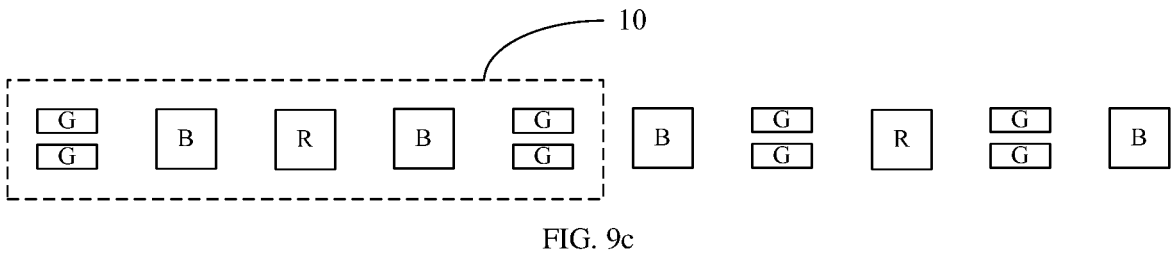
FIG. 9c is schematic structural diagram of two adjacent repeated units according to Embodiment V of the present disclosure.
Figure 9D:
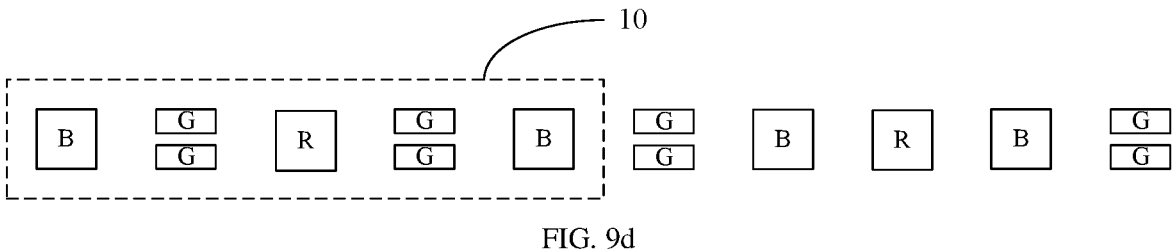
FIG. 9d is schematic structural diagram of two adjacent repeated units according to Embodiment V of the present disclosure.

The difference between this embodiment and the above four embodiments is that, in each repeated unit, the arrangement of two sub-pixels on each side of the first sub-pixel may be different, and the arrangement of adjacent repeated units in the same row may also be different. For example:

For the pixel structures listed in Embodiment I and Embodiment II, in this embodiment, each repeated units 10 may be arranged as: a second sub-pixel 102, a third sub-pixel 103, a first sub-pixel 101, a third sub-pixel 103 and a second sub-pixel 102, i.e., arranged in an order of a green sub-pixel, a blue sub-pixel, a red sub-pixel, a blue sub-pixel, and a green sub-pixel, as shown in FIG. 9a; and may also be arranged as: the third sub-pixel 103, the second sub-pixel 102, the first sub-pixel 101, the second sub-pixel 102, and the third sub-pixel 103, i.e., arranged in an order of a blue sub-pixel, a green sub-pixel, a red sub-pixel, a green sub-pixel, and a blue sub-pixels, as shown in FIG. 9b. Such an arrangement results in the same sub-pixels each from one of the two adjacent repeated units 10 being adjacent, enabling to use the same opening of the evaporation mask to simultaneously evaporate the two sub-pixels. The arrangement of the pixels in two repeated units adjacent to each other may also be changed to avoid the same sub-pixels from being adjacent. As shown in FIG. 9c, the arrangement of two adjacent repeated units 10 is: the first repeated unit 10 is arranged as a second sub-pixel 102, a third sub-pixel 103, a first sub-pixel 101, a third sub-pixel 103 and a second sub-pixel 102; and the second repeated unit is arranged as a third sub-pixel 103, a second sub-pixel 102, a first sub-pixel 101, a second sub-pixel 102, and a third sub-pixel 103. Alternatively, as shown in FIG. 9d, the arrangement of the first repeated unit and the arrangement of the second repeated unit are opposite to the above, the first repeated unit 10 is arranged as a third sub-pixel 103, a second sub-pixel 102, a first sub-pixel 101, a second sub-pixel 102, and a third sub-pixel 103, and the second repeated unit is arranged as a second sub-pixel 102, a third sub-pixel 103, a first sub-pixel 101, a third sub-pixel 103, and a second sub-pixel 102.

It should be noted that, in the accompany drawings of this embodiment (i.e., in FIGS. 9a-9d), only a schematic structural diagram of two adjacent repeated units is shown, and the pixel structure comprises a plurality of repeated units arranged in an array.

Figure 10A:
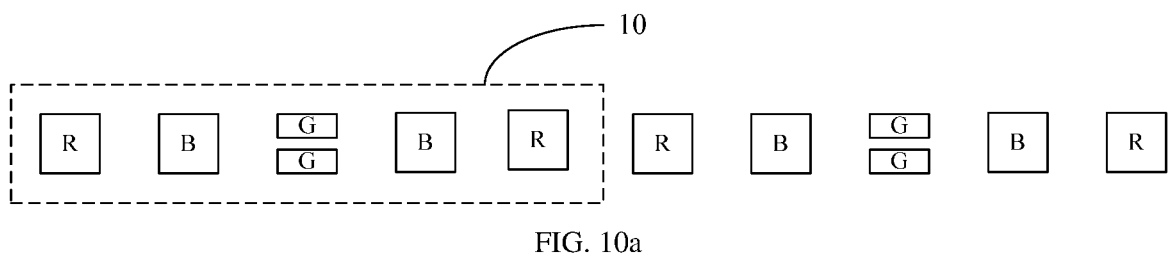
FIG. 10a is schematic structural diagram of two adjacent repeated units according to Embodiment V of the present disclosure.
Figure 10B:
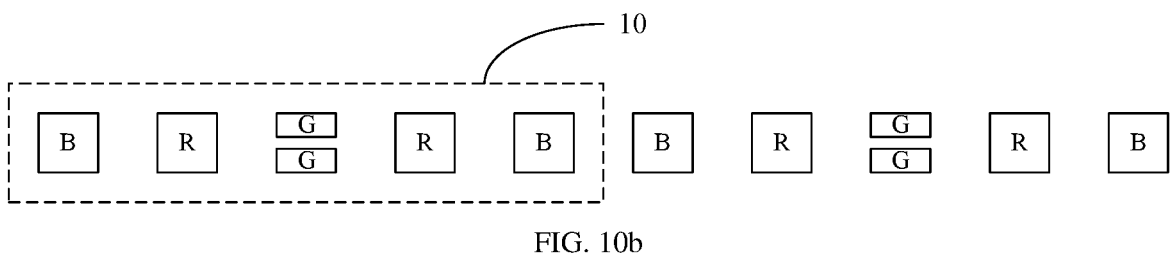
FIG. 10b is schematic structural diagram of two adjacent repeated units according to Embodiment V of the present disclosure.
Figure 10C:
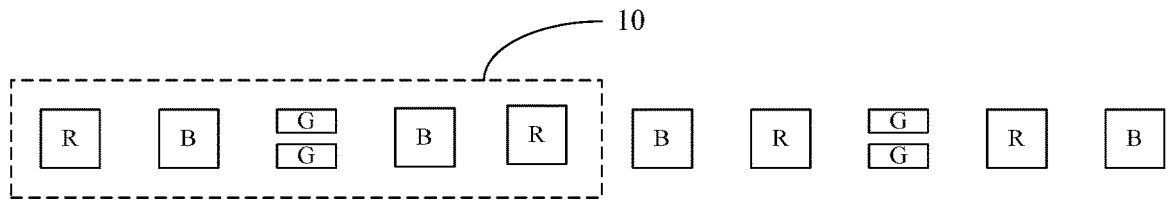
FIG. 10c is schematic structural diagram of two adjacent repeated units according to Embodiment V of the present disclosure.
Figure 10D:
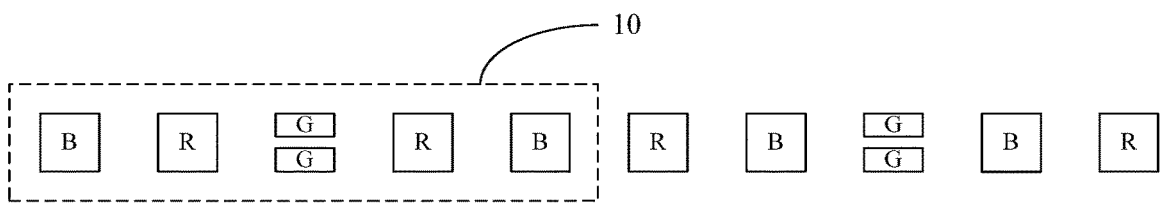
FIG. 10d is schematic structural diagram of two adjacent repeated units according to Embodiment V of the present disclosure.

For the pixel structures listed in Embodiment III and Embodiment IV, in this embodiment, the arrangement of each repeated unit 10 may be: a second sub-pixel 102, a third sub-pixel 103, a first sub-pixel 101, a third sub-pixel 103, and a second sub-pixel 102, i.e., arranged in an order of a red sub-pixel, a blue sub-pixel, a green sub-pixel, a blue sub-pixel, and a red sub-pixel, as shown in FIG. 10a. Alternatively, the arrangement of each repeated unit 10 may be: a third sub-pixel 103, a second sub-pixel 102, a first sub-pixel 101, a second sub-pixel 102, and a third sub-pixel 103, i.e., arranged in an order of a blue sub-pixel, a red sub-pixel, a green sub-pixel, a red sub-pixel, and a blue sub-pixel, as shown in FIG. 10b. Such an arrangement causes the same sub-pixels each from one of the two adjacent repeated units 10 being adjacent, resulting in that the same opening of the evaporation mask is able to be used to simultaneously evaporate two sub-pixels. The arrangement of the pixels in two repeated units adjacent to each other can also be changed to avoid the same sub-pixels from being adjacent. As shown in FIG. 10c, the arrangement of two adjacent repeated units 10 is: the first repeated unit 10 is arranged as a second sub-pixel 102, a third sub-pixel 103, a first sub-pixel 101, a third sub-pixel 103 and a second sub-pixel 102; and the second repeated unit 10 is arranged as a third sub-pixel 103, a second sub-pixel 102, a first sub-pixel 101, a second sub-pixel 102, and a third sub-pixel 103. That is, the sub-pixels in two adjacent repeated units are arranged according to the order of a red sub-pixel, a blue sub-pixel, a green sub-pixel, a blue sub-pixel and a red sub-pixel, and the order of a blue sub-pixel, a red sub-pixel, a green sub-pixel, and a red sub-pixel, and a blue sub-pixel, respectively. The sequence of two adjacent repeated units can be exchanged. As shown in FIG. 10d, in two adjacent repeated units, the first repeated unit 10 is arranged as a third sub-pixel 103, a second sub-pixel 102, a first sub-pixel 101, a second sub-pixel 102, and a third sub-pixel 103, and the second repeated unit 10 is arranged as a second sub-pixel 102, a third sub-pixel 103, a first sub-pixel 101, and a third sub-pixel 103, and a second sub-pixel 102, that is, arranged according to the order of a blue sub-pixel, a red sub-pixel, a green sub-pixel, a red sub-pixel, and a blue sub-pixel, and the order of a red sub-pixel, a blue sub-pixel, a green sub-pixel, a blue sub-pixel, and a red sub-pixel, respectively.

Embodiment VI

Figure 11A:
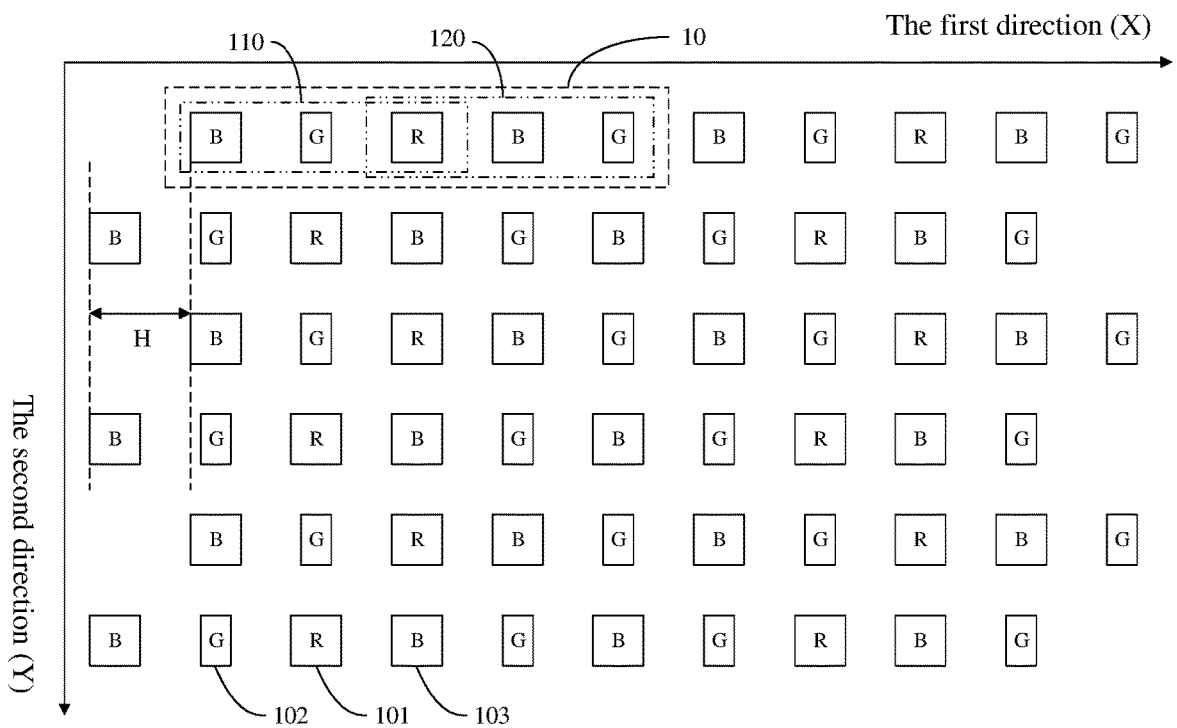
FIG. 11a is schematic structural diagram of a pixel structure according to Embodiment VI of the present disclosure.

FIG. 11a is a schematic structural diagram of a pixel structure according to Embodiment VI of the present disclosure. As shown in FIG. 11a, the present disclosure provides a pixel structure, comprising a plurality of repeated units 10 arranged in an array. Each repeated unit 10 comprises a first pixel unit 110 and a second pixel 120 disposed adjacent to each other in a first direction. The first pixel unit 110 comprises a third sub-pixel 103, a second sub-pixel 102, and a first sub-pixel 101 sequentially arranged in the first direction, and the second sub-pixel unit 120 comprises a first sub-pixel 101, a third sub-pixel 103, and a second sub-pixel 102 sequentially arranged in the first direction. The first sub-pixel 101 is shared by the first pixel unit 110 and the second pixel unit 120. The first sub-pixel 101 is a red sub-pixel (R), the second sub-pixel 102 is a green sub-pixel (G), and the third sub-pixel 103 is a blue sub-pixel (B); and the repeated units 10 adjacent in the second direction are misaligned in the first direction.

The difference between this embodiment and Embodiment I is that, in this embodiment, the area of the second sub-pixel 102 is smaller than the area of the first sub-pixel 101 or the third sub-pixel 103. The area of the green sub-pixel is appropriately reduced due to the green sub-pixel having the highest brightness, while the area of the red sub-pixel is increased due to the red sub-pixel being shared. Moreover, it is also necessary to increase the area of the blue sub-pixel due to the service life of the blue sub-pixel being the shortest.

Preferably, the first sub-pixel 101 and the third sub-pixel 103 have the same shape and area. Therefore, the first sub-pixel 101 and the third sub-pixel 103 are able to be evaporated by using the same evaporation mask, thereby saving the preparation cost of the mask. The shapes and areas of the first sub-pixel 101 and the third sub-pixel 103 may also be different, for example, the shapes are the same, and the areas are different; or the shapes are different, and the areas are the same; or the shapes and areas are both different.

More preferably, the shapes of the first sub-pixel 101 and the third sub-pixel 103 are rectangle or square, the shape of the second sub-pixel 102 being rectangle, the second sub-pixels 102 being arranged along the long-side direction of the second sub-pixels 102. For example, the shape of the first sub-pixel 101 and the third sub-pixel 103 are square, and the length of the long sides of the second sub-pixel 102 is twice the length of the short sides of the second sub-pixel 102. The second sub-pixels 102 may also be arranged in the short-side direction of the second sub-pixel 102. However, it should be understood that the shapes of the first sub-pixel 101, the second sub-pixel 102, and the third sub-pixel 103 are not limited to rectangle, and may be other quadrangles other than rectangle, or may be selected from the group consisting of triangle, pentagon, hexagon, octagon and combinations thereof. The shape and/or area of each sub-pixel may be accordingly adjusted according to the color matching requirements.

Each sub-pixel includes a light-emitting region (a display region) and a non-light-emitting region (a non-display region). The light-emitting region of each sub-pixel includes a cathode, an anode, and an electroluminescent layer (an organic light-emitting layer) The electroluminescent layer is located between the cathode and the anode, and configured to generate light of a predetermined color to achieve display. Generally, the electroluminescent layers of corresponding colors (i.e., red, green, or blue) in the light-emitting regions of the pixel regions having corresponding colors is formed through three layers evaporation processes. If the shapes and the areas of the first sub-pixel 101 and the third sub-pixel 103 are same, a same mask is able to be used to form the electroluminescent layers of red and blue, so that only two masks are needed and prepared, thereby saving the preparation cost of the mask.

The repeated units 10 adjacent in the second direction are misaligned in the first direction. Specifically, the repeated units 10 of the odd-numbered rows are aligned with each other, that is, the arrangement of the repeated units 10 of the odd-numbered rows is identical. The repeated units 10 of the even-numbered rows are aligned with each other, that is, the arrangement of the repeated units 10 of the even-numbered rows is identical. Moreover, the repeated units of the even-numbered rows and the repeated units of the odd-numbered rows are misaligned in the row direction.

Preferably, the misaligned distance between the repeated unit 10 of the even-numbered row and the repeated unit 10 of the odd-numbered row in the row direction includes the sum of the length of one sub-pixel in the first direction and the spacing between the sub-pixel and an adjacent sub-pixel. In this embodiment, the misaligned distance includes the sum of the length of one blue sub-pixel in the first direction and the spacing between the blue sub-pixel and the green sub-pixel. As shown in FIG. 11a, in this embodiment, the distance H between one blue sub-pixel at the leftmost end of the odd-numbered column and one blue sub-pixel at the leftmost end of the even-numbered column includes the length of the blue sub-pixel in the first direction, and also includes the gap between the blue sub-pixel and the green sub-pixel of the odd-numbered row due to the area of the green sub-pixel being smaller than that of the blue sub-pixel.

It should be noted that, through time sequence control of two adjacent pixel unit groups in the second direction, the pixel units in one repeated unit are able to realize left eye display, and the pixel units in the other repeated unit are able to realize right eye display, enabling the application of such pixel structure in VR (Virtue Reality) and 3D (three-dimensional) display technologies.

Figure 11B:
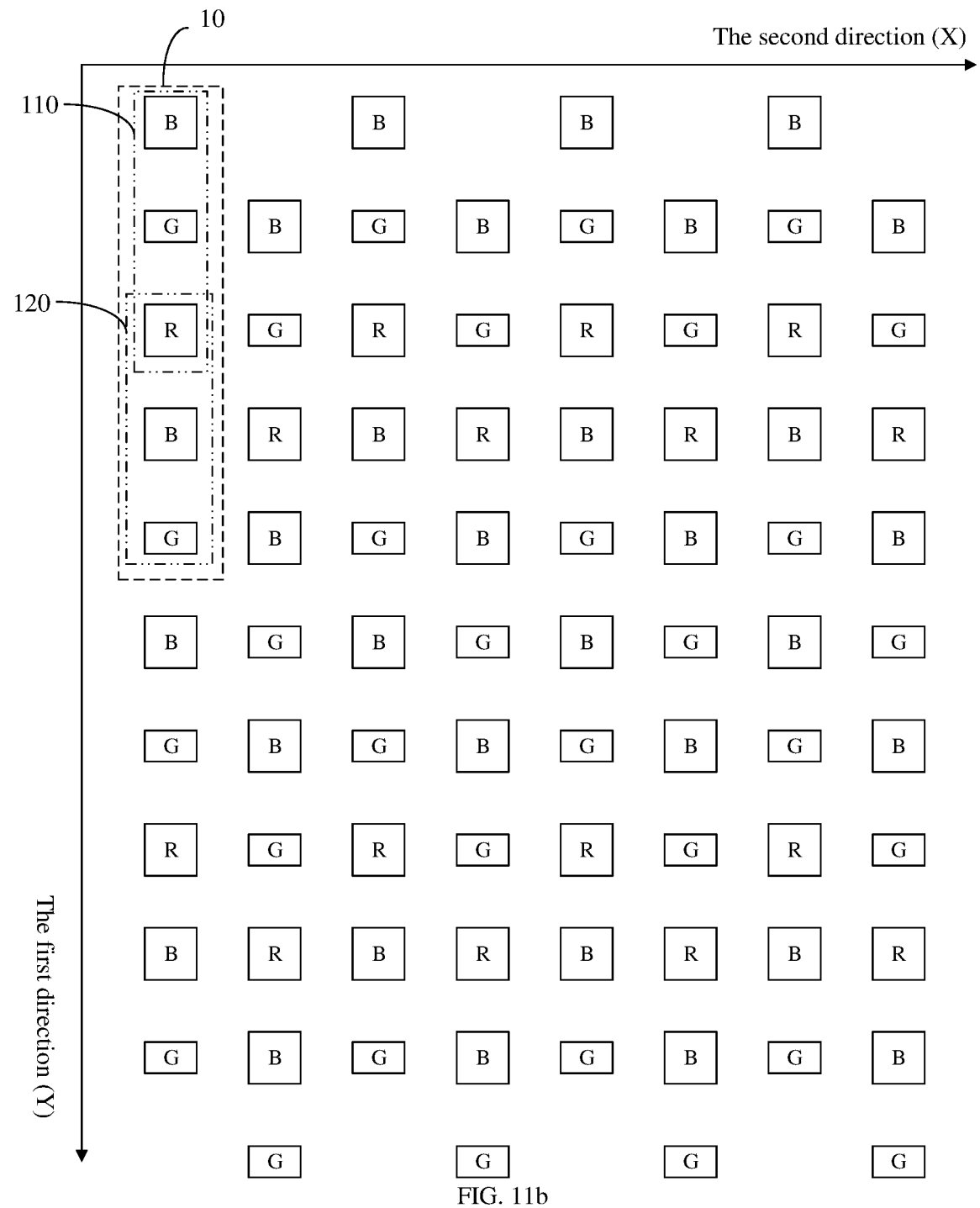
FIG. 11b is schematic structural diagram of a pixel structure according to Embodiment VI of the present disclosure.

Optionally, the pixel structure shown in FIG. 11b is obtained by exchanging the first and second directions of FIG. 11a. The first direction is the column direction, the second direction is the row direction.

Figure 11C:
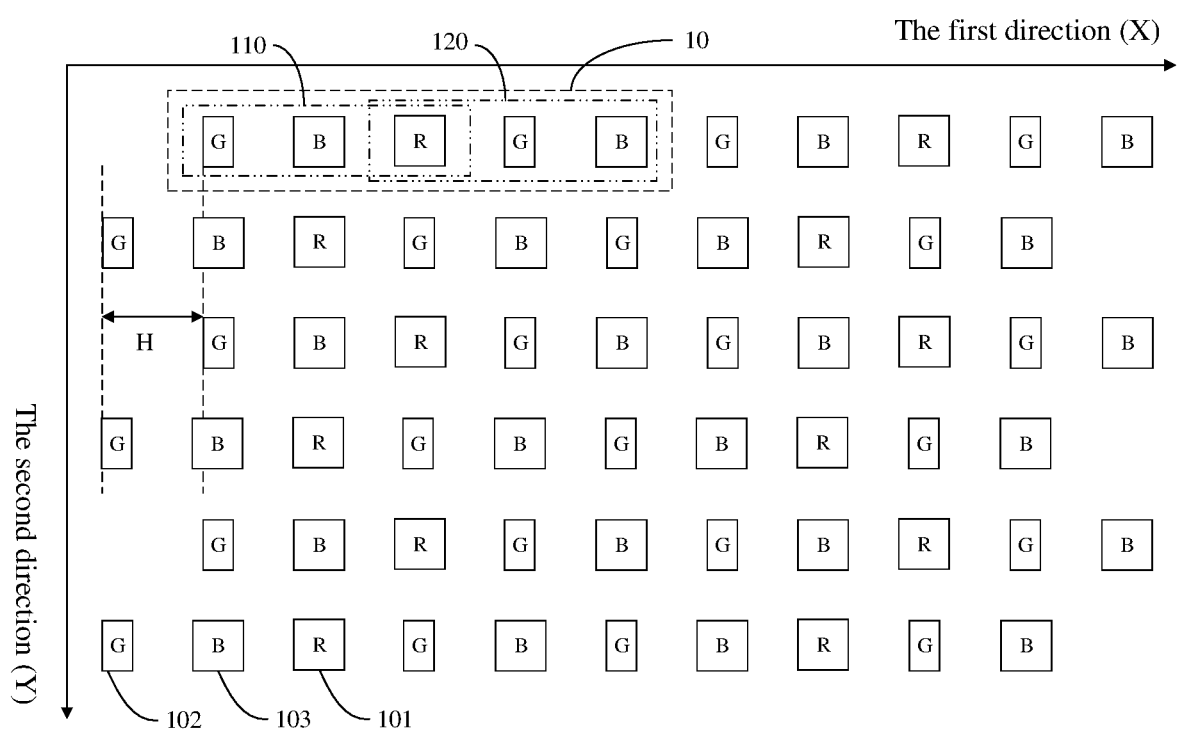
FIG. 11c is schematic structural diagram of a pixel structure according to Embodiment VI of the present disclosure.

Optionally, the pixel structure shown in FIG. 11c is obtained by exchanging the positions of the second sub-pixels and the third sub-pixels in each repeated unit of FIG. 11a, i.e. the second sub-pixel 102, the third sub-pixel 103, the first sub-pixel 101, the second sub-pixel 102, and the third sub-pixel 103 are arranged in each repeated unit 10 in the first direction.

Figure 11D:
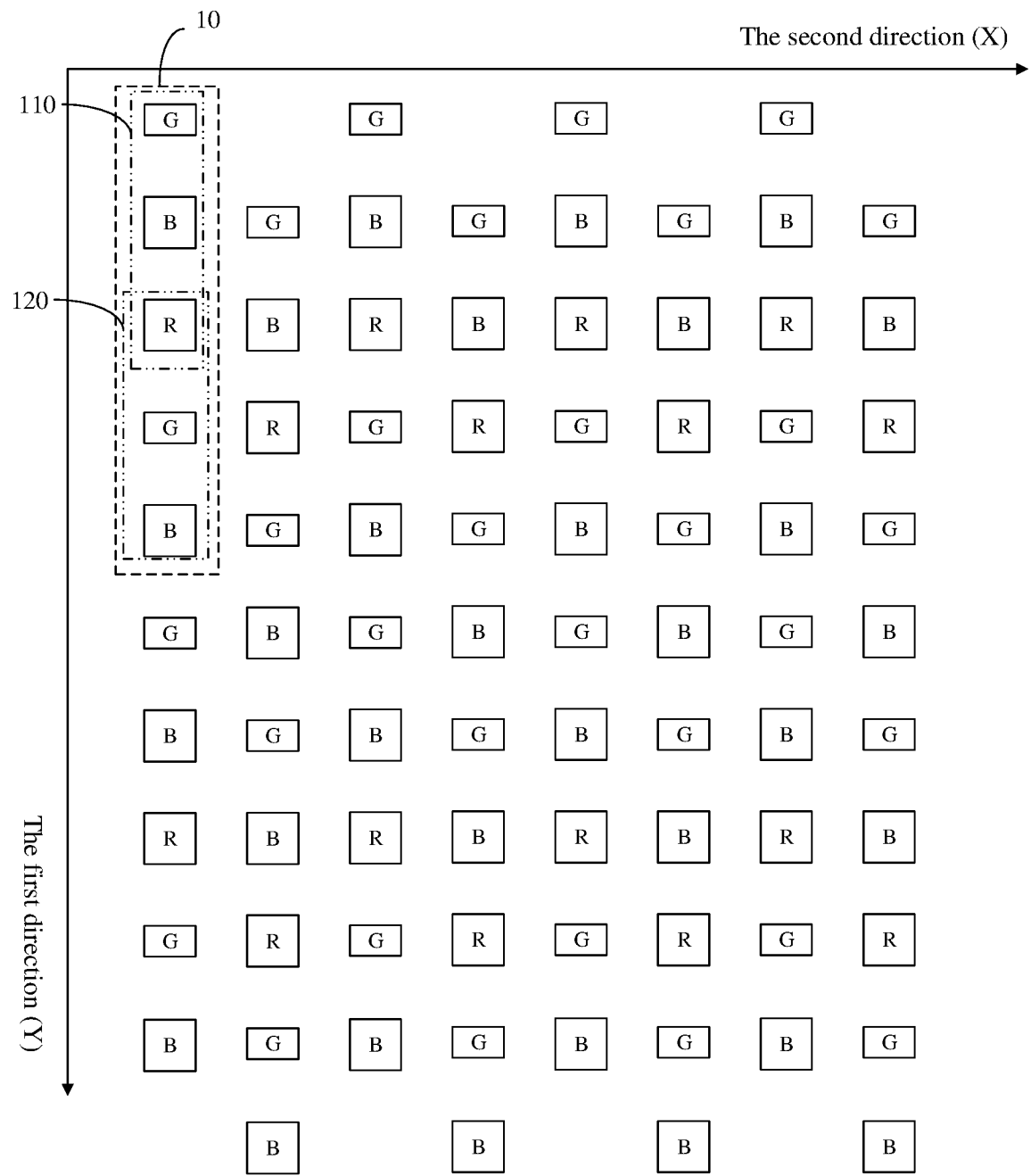
FIG. 11d is schematic structural diagram of a pixel structure according to Embodiment VI of the present disclosure.

Optionally, the pixel structure shown in FIG. 11d can also be obtained by exchanging the first direction and the second direction of FIG. 11c.

Figure 11E:
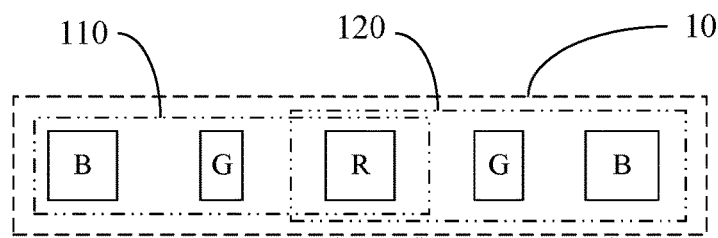
FIG. 11e is schematic structural diagram of a pixel structure according to Embodiment VI of the present disclosure.

Optionally, the pixel structure shown in FIG. 11e is able to be obtained by reversing the first pixel unit 110 of FIG. 11a by 180 degrees in the first direction to make the the first pixel unit 110 to be arranged in the same manner as the second pixel unit 120, i.e. to make the third sub-pixel 103, the second sub-pixel 102, the first sub-pixel 101, the second sub-pixel 102, and the third sub-pixel 103 arranged in each repeated unit 10 in the first direction.

Figure 11F:
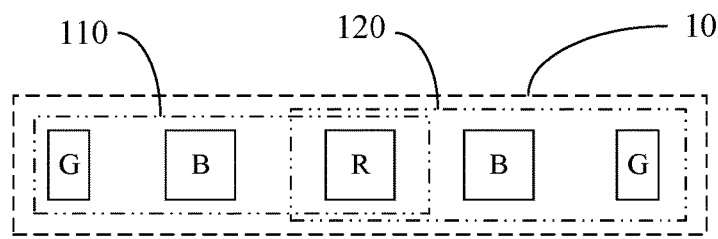
FIG. 11f is schematic structural diagram of a pixel structure according to Embodiment VI of the present disclosure.

Optionally, the pixel structure shown in FIG. 11f is able to be obtained by reversing the first pixel unit 110 of FIG. 11c by 180 degrees in the first direction to make the first pixel unit 110 to be arranged in the same manner as the second pixel unit 120, i.e. to make the second sub-pixel 102, the third sub-pixel 103, the first sub-pixel 101, the third sub-pixel 103, and the second sub-pixel 102 arranged in each repeated unit 10 in the first direction.

In the pixel structures shown in FIG. 11e and FIG. 11f, since the first pixel unit 110 in each repeated unit is reversed by 180 degrees in the row direction, the arrangement of the first pixel unit 110 is the same as that of the second pixel unit 120. Thus, in the pixel structure formed by a plurality of repeated units arranged in an array, the color of the adjacent sub-pixels from one of the adjacent repeated units are same. As shown in FIGS. 11e and 11f, the color of the adjacent sub-pixels from one of the adjacent pixel unit groups are blue or green, thereby the same opening of the evaporation mask is able to be used to evaporate two sub-pixels simultaneously.

Figure 11G:
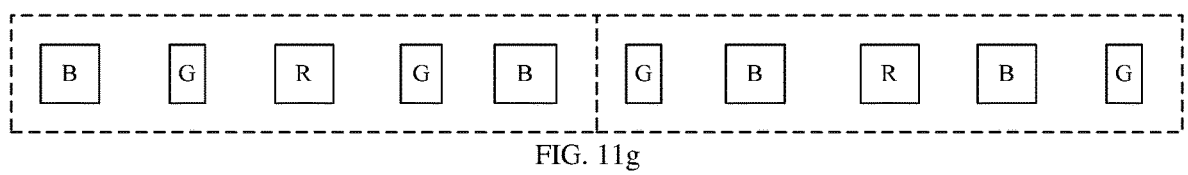
FIG. 11g is schematic structural diagram of a pixel structure according to Embodiment VI of the present disclosure.
Figure 11H:
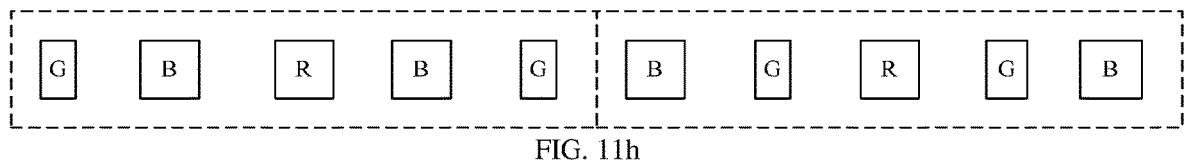
FIG. 11h is schematic structural diagram of a pixel structure according to Embodiment VI of the present disclosure.

The situation that the color of the adjacent sub-pixels is same is also able to be avoided. For example, in two adjacent repeated units, the first repeated unit as shown in FIG. 11e is adopted, and the second repeated unit as shown in FIG. 11f is adopted, so that the schematic structural diagram as shown in FIG. 11g is final obtained and the pixel structure is formed by arranging in an array. Alternatively, the first pixel unit group as shown in FIG. 11f is adopted, and the second pixel unit group as shown in FIG. 11e is adopted, so that the schematic structural diagram as shown in FIG. 11h is final obtained, and similarly, the pixel structure is formed by arranging in an array.

Embodiment VII

This embodiment provides a display apparatus adopting the pixel structure according to any one of Embodiments I to VI.

It should be noted that, the embodiments in this description are described in a progressive manner, and each embodiment focuses on the differences from other embodiments. Therefore, the same or similar parts between the embodiments may be referred to each other.

In summary, the present disclosure provides a pixel structure and a display apparatus. The pixel structure comprises a plurality of repeated units arranged in an array, each repeated unit comprising a plurality of sub-pixels having three colors. There is one sub-pixel of one color, and there are two sub-pixels of the other two colors. The two sub-pixels of the other two colors are located on opposing sides of the sub-pixel of one color, respectively, and the sub-pixel in the middle forms two pixel units with the two sub-pixels on opposing sides, respectively, so that the sharing of the sub-pixel is achieved, facilitating to improve the resolution of the display apparatus. In addition, among the sub-pixels of the three colors, the sub-pixel with the maximum brightness is divided into two secondary sub-pixels, so that the number of sub-pixels with the maximum brightness is increased, thereby increasing the PPI (Pixels Per Inch), and further improving the resolution of the display apparatus. Moreover, the same opening of the evaporation mask is able to be used to evaporate two divided sub-pixels, reducing the difficulties of the preparation process and the evaporation process of the evaporation mask. If the first sub-pixel is a red sub-pixel or a blue sub-pixel, the sharing of the sub-pixels having a longer service life is achieved, thereby balancing lifespans of sub-pixels made of different material, and improving the service life of the display apparatus. The adjacent repeated units in the repeated units adjacent in the second direction are misaligned in the first direction, so that the pixel is arranged more uniform, thereby improving the display effect of the display apparatus; and in the two pixel unit groups adjacent in the second direction, the pixel units of one pixel unit group are used for realizing left eye display, and the pixel units of the other pixel unit group are used for realizing right eye display through the time sequence control, so that the display apparatus comprising the pixel structure is able be used for realizing VR and 3D display.

The above description is only a description of the preferred embodiments of the present disclosure, and is not intended to limit the scope of the present disclosure. Any changes and modifications made by the person skilled in the art according to the above disclosure all fall within the protection scope of the appended claims.

What is claimed is:
1. A pixel structure, comprising:
a plurality of repeated units arranged in an array, each repeated unit comprising one sub-pixel of a first color, two sub-pixels of a second color, and two sub-pixels of a third color, wherein all sub-pixels in each repeated unit are arranged along a first direction;

wherein, the first color, the second color, and the third color are different from one another, and each side of the sub-pixel of the first color is arranged with one of the sub-pixels of the second color and one of the sub-pixels of the third color, along the first direction, wherein a center of a Nth sub-pixel in each repeated unit is arranged in alignment with a center of a N+1th sub-pixel in adjacent repeated unit in a second direction, N being a positive integer, wherein among the sub-pixel of the first color, sub-pixels of the second color, and sub-pixels of the third color, sub-pixels with a maximum brightness is separated into two secondary sub-pixels along the second direction perpendicular to the first direction, and wherein the sub-pixel with the maximum brightness is the sub-pixel of the second color, and the sub-pixel of the second color is separated into two secondary sub-pixels, the sub-pixel of the first color is shared by the sub-pixel of the second color and the sub-pixel of the third color on each side of the sub-pixel of the first color to form two pixel unit groups, and in each of the pixel unit groups, the sub-pixel of the first color and the sub-pixels of the third color form one pixel unit with each of the two secondary sub-pixels separated from the sub-pixel of the second color.

2. The pixel structure according to claim 1, wherein among the sub-pixel of the first color, sub-pixels of the second color, and sub-pixels of the third color, the sub-pixels with a maximum brightness has a smaller area than other sub-pixels.

3. The pixel structure according to claim 2, wherein an area of the sub-pixel of the second color is half of an area of each of the sub-pixel of the first color and the sub-pixel of the third color.

4. The pixel structure according to claim 1, wherein the first color and the third color are selected from red and blue, and the second color is green.

5. The pixel structure according to claim 1, wherein the sub-pixel of the first color is separated into two secondary sub-pixels, and the two secondary sub-pixels of the sub-pixel separated from the first color form two pixel units with the sub-pixel of the second color and the sub-pixel of the third color on opposing sides of the sub-pixel of the first color.

6. The pixel structure according to claim 5, wherein the first color is green, and the second color and the third color are selected from red and blue.

7. The pixel structure according to claim 1, wherein the separated two secondary sub-pixels are simultaneously formed through evaporation by using one opening of an evaporation mask.

8. The pixel structure according to claim 1, wherein a plurality of sub-pixels in the repeated unit are arranged along a first direction, and adjacent repeated units in a second direction are misaligned in the first direction.

9. The pixel structure according to claim 8, wherein the first direction is a row direction, and the second direction is a column direction; the repeated units of odd-numbered rows are aligned with each other, the repeated units of even-numbered rows are aligned with each other; and the repeated units of even-numbered rows and the repeated units of odd-numbered rows are misaligned in the row direction; or the first direction is a column direction, and the second direction is a row direction, the repeated units of odd-numbered columns are aligned with each other, and the repeated units of even-numbered columns are aligned with each other; and the repeated units of the even-numbered columns and the repeated units of the odd-numbered columns are misaligned in the column direction.

10. The pixel structure according to claim 8, wherein the first direction is perpendicular to the second direction.

11. The pixel structure according to claim 1, wherein, a shape of the sub-pixel of the first color is rectangle, triangle, pentagon, hexagon, or octagon;

a shape of the sub-pixels of the second color is rectangle, triangle, pentagon, hexagon, or octagon; and a shape of the sub-pixel of the third color is rectangle, triangle, pentagon, hexagon, or octagon.

12. The pixel structure according to claim 8, wherein in two adjacent repeated units in the second direction, the pixel unit in one repeated unit is used for realizing left eye display, and the pixel unit in the other repeated unit is used for realizing right eye display.

13. The pixel structure according to claim 1, wherein colors of adjacent sub-pixels each from one of the two adjacent repeated units are different.

14. A display device, comprising the pixel structure according to claim 1.

* * * * *